United States Patent
Tsubata

(10) Patent No.: US 6,878,506 B2
(45) Date of Patent: Apr. 12, 2005

(54) METHOD FOR MANUFACTURING SEMICONDUCTOR DEVICE

(75) Inventor: Kyoichi Tsubata, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 227 days.

(21) Appl. No.: 10/376,234

(22) Filed: Mar. 3, 2003

(65) Prior Publication Data

US 2003/0164353 A1 Sep. 4, 2003

(30) Foreign Application Priority Data

Mar. 1, 2002 (JP) ........................................ 2002-055754

(51) Int. Cl.$^7$ ................................................. G03C 5/00
(52) U.S. Cl. ........................ 430/311; 430/312; 430/313; 438/401
(58) Field of Search ............................ 430/5, 311–313, 430/396; 438/401

(56) References Cited

U.S. PATENT DOCUMENTS

| | | | | |
|---|---|---|---|---|
| 4,663,534 A | * | 5/1987 | Ayata et al. ................. 250/548 |
| 5,138,176 A | * | 8/1992 | Nishi ......................... 250/548 |
| 6,667,253 B2 | * | 12/2003 | Song et al. .................. 438/401 |
| 2004/0075179 A1 | * | 4/2004 | Liu et al. .................... 257/797 |
| 2004/0086793 A1 | * | 5/2004 | Sreenivasan et al. ......... 430/22 |
| 2004/0092080 A1 | * | 5/2004 | Chen .......................... 438/401 |
| 2004/0102014 A1 | * | 5/2004 | Ning et al. .................. 438/393 |

* cited by examiner

Primary Examiner—Duy-Vu N. Deo
(74) Attorney, Agent, or Firm—Sughrue Mion, PLLC

(57) ABSTRACT

The manufacturing method of the semiconductor device provides reduction of the photoresist film distortion occurred in a development procedure and, as a result, makes measurement of the place difference of the photoresist mask correct. The manufacturing method of the semiconductor device to be published are those the photoresist film consisting the upper alignment-measuring mark is placed more than about 200 μm from an corner in device forming region formed adjoining scribing region, along with X-direction which is the measurement direction in scribing region formed on semiconductor substrate.

24 Claims, 7 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device, and more particularly to the method for manufacturing the semiconductor device using a lithography technique.

The present application claims priority of Japanese Patent Application No. 2002-055754 filed on Mar. 1, 2002, which is hereby incorporated by reference.

2. Description of the Related Art

In manufacturing of a semiconductor device such as an LSI (Large Scale Integrated circuit) or a like, a photolithography is used as a requisite process so as to produce a fine pattern of a thin film formed on a semiconductor substrate, for example, an insulating film such as an oxide film, or a conductive film such as a wiring film, or a like.

For example, in a case of producing a fine pattern of the insulating film using this kind of photolithography technique, photoresist is coated on the insulating film to form a photoresist film thereon. Next, an exposing process is performed by irradiating the photoresist film with an ultraviolet ray output from a light source such as a laser or a like, through a mask with a specified pattern. After this, a development process is performed to form a photoresist mask having a specified fine pattern, and followed by etching process to produce a fine pattern of the insulating film, using the formed photoresist mask.

Therefore, a fine patterning process of the insulating film is performed by etching processes using this photoresist mask. These photoresist mask formation processes are performed repeatedly in more than one process that requires photolithographic process.

In the case of these formations of each photoresist mask by repeating the processes corresponding with photolithographic processes, the amount of deviation of the photoresist mask formed from the right designed alignment is measured. Though the amount of deviation of the photoresist mask is usually determined depending on the accuracy of a exposure system (equipment), so called repeating procedures are performed since the photolithographic processes according to designed first layer of film are difficult in the case of the amount of deviation is relatively large from the result of the measurement of the amount of deviation. An increase of a cost is unavoidable when the repeating procedures are performed since the number of the processes is increased.

The above measurement of the amount of deviation of the photoresist mask is performed as the followings: firstly a first alignment-measuring mark for the measurement of a aligned side (hereinafter may be referred to as lower alignment-measuring mark) is formed on the semiconductor substrate as a groundwork, secondary the photoresist film is formed on the substrate after the formation of the insulating film which is a first layer of film, thirdly at the same time of the formation of the above photoresist mask exposing and developing the photoresist film, a second alignment-measuring mark for the measurement on a aligning side (hereinafter may be referred to as upper alignment-measuring mark) being comprised by the above photoresist film is formed so that the upper alignment-measuring mark on the aligning side corresponds to and is overlaid on the lower alignment-measuring mark on the aligned side. Then the amount of relative deviation between the upper alignment-measuring mark and the lower alignment-measuring mark is measured by the exposure system using the measurement for the alignment.

Next, with reference to FIGS. 10A, 10B and 10C, a conventional method for manufacturing a semiconductor device, for example, a semiconductor device as shown in FIG. 11 will be explained sequentially as follows. Firstly, as shown in FIG. 10A, and a device forming region 52 and a mark forming region 53 are allocated on a p-type of a semiconductor substrate 51 for example, and a lower alignment-measuring mark 55 is formed in the mark forming region 53 of the semiconductor substrate 51. In the lower alignment-measuring mark 55, a recessed portion 54 whose a planar shape thereof is of almost square fore example as mentioned later is formed in a scribing region 68 as the mark forming region 53 on the semiconductor substrate 51, by performing an etching process or a like. The lower alignment measuring mark 55 may be formed in the regions other than the cell regions, not being restricted to the scribing region 68 (as shown in FIG. 15). Next, a photoresist film 57 is formed by coating the photoresist on all the surface of the insulating film 56, after forming insulating film 56 such as an oxide film throughout on the surface of the semiconductor substrate 51.

As shown in FIG. 10B, using the photolithographic process, at a same time of forming a photoresist mask 59 with a specified pattern in which a photoresist-removed opening portion such as a trench or a hole (hereinafter may be referred to as opening portion) 58 is formed in the device forming region 52, by exposing the ultraviolet ray from a source of light such as a laser through a photomask (not shown) with a specified circuit pattern to the photoresist film 57, and developing an upper alignment-measuring mark 61 corresponding to the lower alignment-measuring mark 55 on the mark forming region 53.

The upper alignment-measuring mark 61 is made up of a photoresist pattern 60 whose plan shape is of square for example, and placed for example in the inside of the lower alignment-measuring mark 55 made up of the recessed portion 54 for example whose plan shape is of square, as mentioned before. In this case, the photoresist mask 59 and the photoresist pattern 60 which are formed on the device forming region 52 and the mark forming region 53 respectively are formed whose film thickness are the same since they are formed by the same procedures.

Next, alignment is checked, so as to make sure whether the photoresist mask 59 having the specified pattern made up of the opening portion 58 is in the right place with the lower pattern. That is, by using the lower alignment-measuring mark 55 formed on the lower layer and the upper alignment-measuring mark 61 formed on the upper layer as shown in FIG. 12, a relative amount of deviation from a right alignment between the lower alignment-measuring mark 55 and the upper alignment-measuring mark 61 in the X-direction (horizontal direction) or in the Y-direction (vertical direction) is measured. This means that the relative deviation between the lower alignment-measuring mark 55 and the upper alignment-measuring mark 61 is optically measured using the upper alignment-measuring mark 61 as mentioned above. Then when the result of the deviation measurement shows that the deviation is within tolerance, the photoresist mask 59 is judged to be formed with great alignment accuracy. An N-type semiconductor region 62 is formed selectively on the semiconductor substrate 51 by implanting ions which are n-type impurities such as phosphorus (P) through the opening portion 58 in the device forming region 52 using the photoresist mask 59, as shown in FIG. 10B. In this process, the above impurity ion is not implanted into the mark forming region 53 due to a masking effect of both of the photoresist film 57 and the insulating film 56, since the photoresist film 57 and the insulating film 56 are formed and stacked on the mark forming region 53. On the other hand, when it is judged that the photoresist mask 59 is not formed in the device forming region 52 with great alignment accuracy, the processing as above is repeated.

The photoresist mask 59 and the photoresist pattern 60 are removed by the method such as ashing, as shown in FIG. 10C. Then, a semiconductor device 63 as shown in FIG. 11 is manufactured, thermally stabilizing the semiconductor substrate 51 including the N-type semiconductor region 62 by annealing. In reality, the semiconductor device 63 is manufactured by repeating the photolithographic process as the above two or more times, the embodiment of a single step out of photolithographic processing for forming the N-type semiconductor region 62 is used to make the explanation simple.

In the manufacturing process of a semiconductor device 63, a plurality of device regions (circuit device regions) having a same circuit pattern are formed on a piece of the semiconductor substrate 51, then finally dicing of the semiconductor substrate 51 is performed on each semiconductor chip on which each device region is formed. In order to form more than one of the device regions on the semiconductor substrate 51 as mentioned above, patterns corresponding to each device region are transferred repeatedly using the mask (reticle mask) in which the patterns are drawn. The pattern repeatedly transferring process as the above is performed, as shown in FIG. 13, generally by using a reducing-projection type of exposure equipment called an aligner, a stepper, or a like, by using a photomask 66 made up of a semiconductor device pattern 65 with the size of four times or five times larger than a final pattern size of a product and the upper alignment-measuring mark 61 (FIG. 14) on an aligning side, and by exposing an ultra-violet ray to the photoresist film formed on the semiconductor substrate 51 through the reducing-projection lens 67. Thus, the semiconductor device pattern 65 and the upper alignment-measuring mark 61 having respectively a final pattern size of a product are formed on the photoresist film by repeating reducing projection exposure and performing a subsequent developing process.

In the repeating transfer processes of patterns as mentioned above, since the upper alignment-measuring mark 61 is used only for the measurement of the deviation of the photoresist mask 59, the upper alignment-measuring marks 61 are formed in regions other than the device forming region 52, that is, in the scribing regions 68 other than a cell region, and are formed in detail for example in four positions around a periphery of the semiconductor device pattern 65 (one-shot-exposing region) as shown in FIG. 14. FIG. 15 is a plan view showing the semiconductor substrate 51 provided with four upper alignment-measuring marks 61 adjacent to the device forming region 52, and formed by performing pattern repeatedly transferring process. The lower alignment-measuring mark 55 and the upper alignment-measuring mark 61 used for the measurement of the deviation of the photoresist mask 59 show the status that each of them is formed on the scribing region 68 for dicing without adversely affecting for forming a semiconductor device. The semiconductor substrate 51 is diced along with X and Y directions of the scribing region 68, and it is divided into each semiconductor chip as mentioned above.

Each of the lower alignment-measuring mark 55 and the upper alignment-measuring mark 61 as shown in FIG. 12 is placed in the scribing region 68 as shown in FIG. 15. Also, the photoresist film is not removed in the scribing region 68 but on the other hand the photoresist film is removed in each device forming region 52, as shown in the same figure. A photoresist-removed region 70 is set on the photoresist film in the scribing region 68 as shown in FIG. 12 so that the photoresist film in the scribing region 68 is removed and that the upper alignment-measuring mark 61 on the upper side is formed on the photoresist-removed region 70.

On the other hand, in the conventional manufacturing processes in the semiconductor device 63 there is a problem that measurement errors in appearance occur in the measurement of the deviation of the photoresist mask 59 using the photoresist film.

In other words, in the conventional method of the manufacturing processes of the semiconductor devices 63, the upper alignment-measuring mark 61 on the upper side making up the photoresist pattern 60 are formed so that the upper alignment-measuring mark 61 are overlaid on the lower alignment-measuring mark 55 using the scribing region 68 on the semiconductor substrate 51 as the mark forming region 53. However, in the conventional process the upper alignment measuring mark 61 on the upper side are formed with no relations to the device forming regions 52 around the scribing region 68 and a data ratio of the photoresist film (a ratio of a removed area to a remaining area).

Therefore, there occurs a phenomenon that the photoresist pattern 60 making up an arbitrary upper alignment-measuring mark 61 becomes deformed to be asymmetrical in a cross sectional shape, under the influence of an adjacent photoresist pattern making up another upper alignment-measuring mark 61, or of the photoresist film remaining in the scribing region 68 as shown in FIG. 16, The deformation (loss of its shape) of the photoresist pattern 60 making up the upper alignment-measuring mark 61 becomes remarkable as materials being different from each other or thickness of the photoresist film being thick. This tendency suggests that the deformation of the photoresist pattern 60 will be large considering the fact that the photoresist mask 59 is used in the ion impurities implantation process which is one of the main processes in manufacturing the semiconductor device such as LSIs, particularly deep ion impurities implantation process is required according to the recent tendency of high performance of LSIs, and a thick photoresist film for more than 4 μm is required according to this trend.

Thus, a margin of error in appearance occurs since the alignment of the photoresist mask is measured incorrectly as if a place difference of the photoresist mask 59 is occurred more than that of the actual difference in the measurement of the place difference of the photoresist mask 59 when the photoresist pattern 60 making up the upper alignment-measuring mark 61 changes its shape. A misconception of the margin of error in appearance as the actual place difference occurs in the manufacturing process of the semiconductor device when such a margin of measurement error in appearance occurs. Therefore, productivity of the semiconductor device becomes lower since unnecessary reprocessing is to be performed.

SUMMARY OF THE INVENTION

In view of the above, it is an object of the present invention to provide a method for manufacturing a semiconductor device being capable of preventing an upper alignment-measuring mark being made up of a photoresist film from chnging shape through a development process, hereby of measuring accurately an alignment deviation of a photoresist mask.

According to a first aspect of the present invention, there is provided a method for manufacturing a semiconductor device including:

a first step of forming a first alignment-measuring mark having a recessed pattern on a surface of a semiconductor, by using a photoetching process;

a second step of coating the surface of the semiconductor on which the first alignment-measuring mark is formed, with a photoresist film;

a third step of patterning the photoresist film by using a photolithography technique and of forming a photoresist mask with a second alignment-measuring mark on the semiconductor, wherein the second alignment-measuring mark is aligned to be overlaid on the first alignment-measuring mark;

hereby measuring a relative deviation from a right alignment between the first alignment-measuring mark and the second alignment-measuring mark;

wherein the second alignment-measuring mark is placed at a specified position on the semiconductor so that a ratio between a total area of photoresist-removed portions and a total area of photoresist-remaining portions within a first specified region extending in a first measuring direction from a center of the second alignment-measuring mark is equal approximately to that within a second specified region extending in a second measuring direction opposite to the first measuring direction from the center of the second alignment-measuring mark, the first alignment-measuring mark and the second alignment-measuring mark being located outside a cell region, and the first specified region and the second specified region being set outside the cell region.

In the foregoing, a preferable mode is one wherein each of the first alignment-measuring mask and the second alignment-measuring mask is formed as a rectangular shape of a planar pattern.

Another preferable mode is one wherein the photoresist film making up the second alignment-measuring mark is set to be more than 4 $\mu$m in thickness.

Still another preferable mode is one wherein the first specified region and the second specified region are set to be almost symmetrical with respect to the center line of the second alignment-measuring mark.

An additional preferable mode is one wherein the first alignment-measuring mark and the second alignment-measuring mark are located within a scribing region outside the cell region, and the first specified region and the second specified region are set within the scribing region outside the cell region.

A furthermore preferable mode is one wherein the scribing region is set to be within a range of 80 $\mu$m to 120 $\mu$m in width.

According to a second aspect of the present invention, there is provided a method for manufacturing a semiconductor device including:

a first step of forming a first alignment-measuring mark having a recessed pattern on a surface of a semiconductor, by using a photoetching process;

a second step of coating the surface of the semiconductor on which the first alignment-measuring mark is formed, with a photoresist film;

a third step of patterning the photoresist film by using a photolithography technique and of forming a photoresist mask with a second alignment-measuring mark on the semiconductor, wherein the second alignment-measuring mark is aligned to be overlaid on the first alignment-measuring mark;

hereby measuring a relative deviation from a right alignment between the first alignment-measuring mark and the second alignment-measuring mark;

wherein the second alignment-measuring mark is placed at a specified position on the semiconductor so that a ratio between a total area of photoresist-removed portions and a total area of photoresist-remaining portions within a first specified region extending in a first measuring direction from a center of the second alignment-measuring mark is equal approximately to that within a second specified region extending in a second measuring direction opposite to the first measuring direction from the center of the second alignment-measuring mark, the first alignment-measuring mark and the second alignment-measuring mark being located outside a device forming region, and the first specified region and the second specified region being set outside the device forming region; and wherein the second alignment-measuring mark is placed at a distance of more than 200 $\mu$m from a corner of the device forming region being adjacent to the first specified region or the second specified region, in the first measuring direction or the second measuring direction According to a third aspect of the present invention, there is provided a method for manufacturing a semiconductor device including:

a first step of forming an insulating film on a semiconductor and then of forming a first alignment-measuring mark having a recessed pattern on a surface of formed the insulating film, by using a photoetching process;

a second step of coating the surface of the insulting film on which the first alignment-measuring mark is formed, with a photoresist film;

a third step of patterning the photoresist film by using a photolithography technique and of forming a photoresist mask with a second alignment-measuring mark on the insulting film, wherein the second alignment-measuring mark is aligned to be overlaid on the first alignment-measuring mark;

hereby measuring a relative deviation from a right alignment between the first alignment-measuring mark and the second alignment-measuring mark;

wherein the second alignment-measuring mark is placed at a specified position on the insulting film so that a ratio between a total area of photoresist-removed portions and a total area of photoresist-remaining portions within a first specified region extending in a first measuring direction from a center of the second alignment-measuring mark is equal approximately to that within a second specified region extending in a second measuring direction opposite to the first measuring direction from the center of the second alignment-measuring mark, the first alignment-measuring mark and the second alignment-measuring mark being located outside a cell region, and the first specified region and the second specified region being set outside the cell region.

According to a fourth aspect of the present invention, there is provided a method for manufacturing a semiconductor device including:

a first step of forming an insulating film on a semiconductor and then of forming a first alignment-measuring mark having a recessed pattern on a surface of formed the insulating film, by using a photoetching process;

a second step of coating the surface of the insulting film on which the first alignment-measuring mark is formed, with a photoresist film;

a third step of patterning the photoresist film by using a photolithography technique and of forming a photoresist mask with a second alignment-measuring mark on the insulting film, wherein the second alignment-measuring mark is aligned to be overlaid on the first alignment-measuring mark;

hereby measuring a relative deviation from a right alignment between the first alignment-measuring mark and the second alignment-measuring mark;

wherein the second alignment-measuring mark is placed at a specified position on the insulting film so that a ratio between a total area of photoresist-removed portions and a total area of photoresist-remaining portions within a first specified region extending in a first measuring direction from a center of the second alignment-measuring mark is equal approximately to that within a second specified region extending in a second measuring direction opposite to the first measuring direction from the center of the second alignment-measuring mark, the first alignment-measuring mark and the second alignment-measuring mark being located outside a device forming region, and the first specified region and the second specified region being set outside the device forming region; and wherein the second alignment-measuring mark is placed at a distance of more than 200 µm from a corner of the device forming region being adjacent to the first specified region or the second specified region, in the first measuring direction or the second measuring direction.

With the above configurations, in case of the measurement of a relative deviation between the alignment mark for the measurement on the aligned side and that on the aligning side the deformation of the photoresist film based on the data ratio of the alignment mark for the measurement on the aligning side can be almost the same in the direction to be measured since the alignment mark for the measurement on the aligning side is placed so that the ratio of removed areas of the photoresist film to remaining areas of the photoresist film between both sides of the alignment mark is almost the same. Therefore, errors in appearance due to the deformation of the photoresist film are hardly occurred.

Accordingly, it is possible to prevent an upper alignment-measuring mark being made up of a photoresist film from changing shape through a development process, hereby of measuring accurately an alignment deviation of a photoresist mask.

BRIEF DESCRIPTION OF THE DRAWINGS

The above and other objects, advantages, and features of the present invention will be more apparent from the following description when taken in conjunction with the accompanying drawings in which.

DETAILED DESCRIPTION OF THE PREFERRED EMBODIMENT

Best modes for carrying out the present invention will be described in further detail using embodiments with reference to the accompanying drawings.

First Embodiment

Figure 1A:
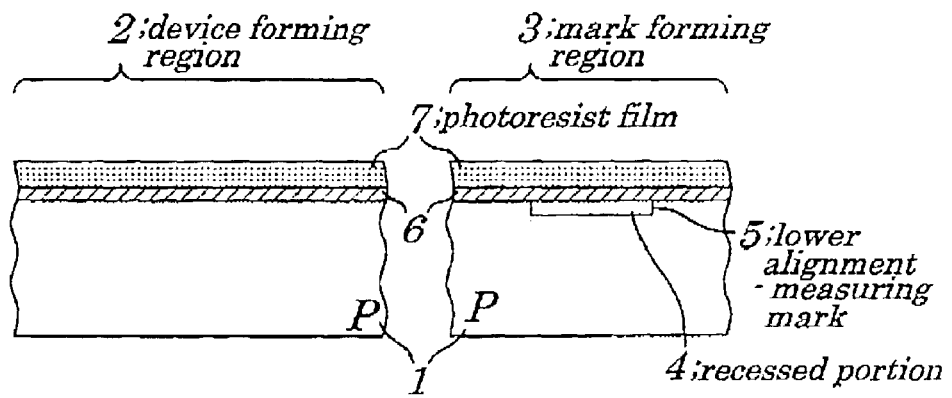
FIGS. 1A, 1B, and 1C are process diagrams for showing in order a method for manufacturing a semiconductor device according to a first embodiment of the present invention.
Figure 1B:
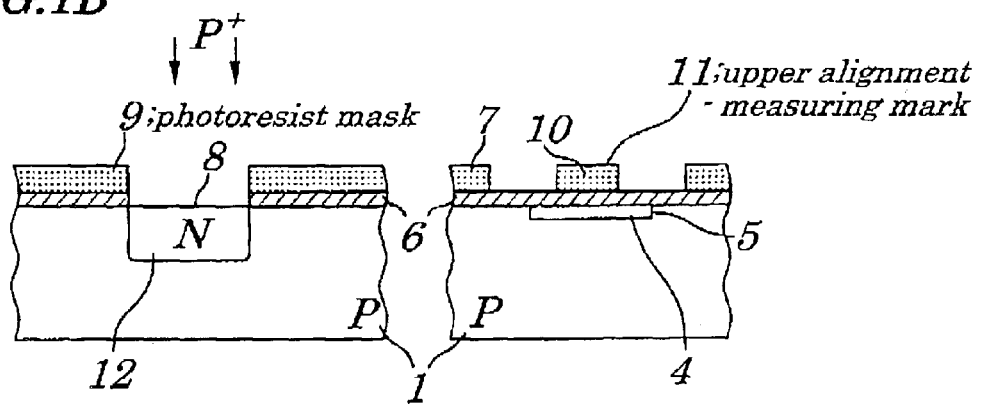
Figure 1C:
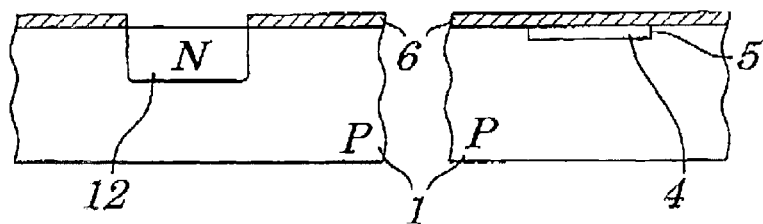
Figure 2:
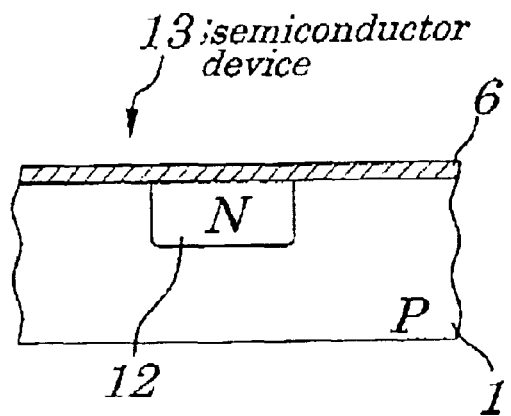
FIG. 2 is a cross section view showing schematically the semiconductor device produced using the method according to the first embodiment of the present invention.
Figure 3:
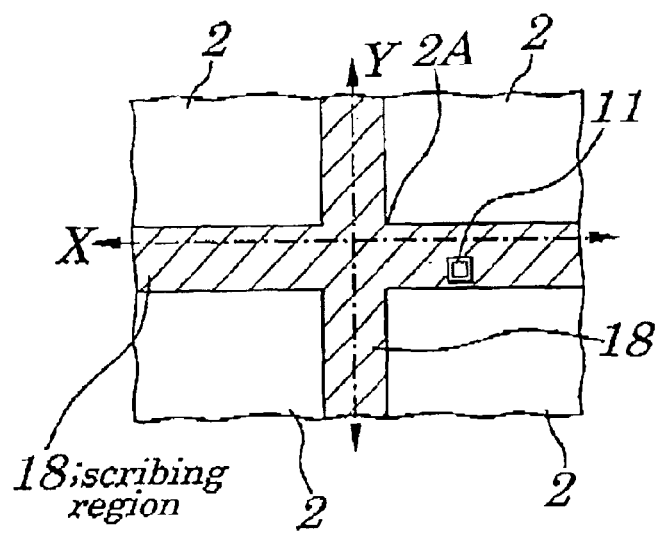
FIG. 3 is a plan view showing a main part of a semiconductor substrate obtained by performing a main process in the method according to the first embodiment of the present invention.
Figure 4:
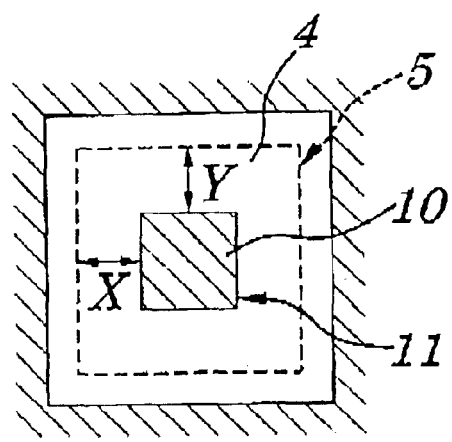
FIG. 4 is an enlarged plan view showing a part of FIG. 3.
Figure 5:
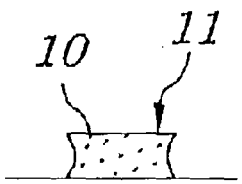
FIG. 5 is a cross sectional view showing a cross sectional shape of a photoresist pattern shape making up an upper alignment-measuring mark formed in the method according to the first embodiment of the present invention.

FIGS. 1A, 1B, and 1C are process diagrams for showing in order a method for manufacturing a semiconductor device according to a first embodiment of the present invention, FIG. 2 is a cross section view showing schematically the semiconductor device produced using the method according to the first embodiment, FIG. 3 is a plan view showing a main part of a semiconductor substrate obtained by performing a main process in the method according to the first embodiment, FIG. 4 is an enlarged plan view showing a part of FIG. 3, and FIG. 5 is a cross sectional view showing a cross sectional shape of a photoresist pattern shape making up an upper alignment-measuring mark 11 formed in the method according to the first embodiment.

The method for manufacturing the semiconductor device 13 according to the embodiment will be described with reference to FIG. 1 to FIG. 5 and FIG. 7.

Firstly, as shown in FIG. 1A, and a device forming region 2 and a mark forming region 3 are allocated on a P,-type of a semiconductor substrate 1 for example, and a lower alignment-measuring mark 5 is formed in the mark forming region 3 of the semiconductor substrate 1. In the lower alignment-measuring mark 5, a recessed portion 4 whose a planar shape thereof is of almost square, for example, as mentioned later is formed as the mark forming region 3 in a scribing region 18 on the semiconductor substrate 1, by performing an etching process or a like. The lower alignment-measuring mark 5 may be formed in the regions other than the cell regions, not being restricted to the scribing region 18 (as shown in FIG. 3). Next, a photoresist film 7 of about 4 μm in thickness is formed by coating the photoresist throughout on the surface of an insulating film 6, after having formed the insulating film 6 such as an oxide film or a like on all the surface of the semiconductor substrate 1.

Next, as shown in FIG. 1B, in a photolithographic process, it is performed to expose the photoresist film 7 to an ultraviolet ray from a source such as a laser through a photo mask (not shown) with a specified pattern, and then to develop the photoresist film 7, hereby forming a photoresist mask 9 with a specified pattern having an opening region 8 in the device forming region 2 and an upper alignment-measuring mark 11 in the mark forming region 3 at a same time. The photoresist mask 9 is used in a subsequent etching process, and it is expected that the upper alignment-measuring mark 11 is placed in a proper alignment with the corresponding lower alignment-measuring mark 5, as formed in an earlier process.

Here, not only upper alignment-measuring mark 11 but various kinds of patterns (not shown) are formed in the scribing region 18.

The upper alignment-measuring mark 11 as also shown in FIG. 4, is made up of, for example, a photoresist pattern 10 having a flat planar shaped square, and formed in such a manner that the upper alignment-measuring mark 11 are placed on and inside the lower alignment-measuring mark 5 made up of the recessed portion 4 for example whose plan shape is square. In this case, the photoresist mask 9 and the photoresist pattern 10 being formed on the device forming region 2 and the mark forming region 3 respectively are formed in the same film thickness since they are formed at the same time. The recessed portion 4 making up the lower alignment-measuring mark 5 is formed for example in a square whose one side of the recessed portion 4 is 30 μm to 40 μm in length, and the photoresist pattern 10 making up the upper alignment-measuring mark 11 is formed, for example, in a square shape of which one side of the photoresist pattern 10 is 8 μm to 12 μm in length.

The photoresist mask 9 and the photoresist pattern 10 are formed, generally by using a reducing projection type of exposure equipment called an aligner, a stepper or a like, by using a photomask made up of a semiconductor device pattern with the size of four times or five times larger than a final pattern size of a product and the upper alignment-measuring mark 11 on an aligning side, and by exposing an ultra-violet ray to the photoresist film 7 formed on the semiconductor substrate 1 through a reducing projection lens. Thus, the semiconductor device pattern and the upper alignment-measuring mark 11 having respectively a final pattern size of a product are formed on the photoresist film 7 by repeating reducing projection exposure and performing a subsequent developing process.

FIG. 3 is a plan view showing the semiconductor substrate 1 provided with four upper alignment-measuring marks 11 adjacent to the device forming region 2, and formed by performing pattern repeatedly transferring process. The lower alignment-measuring mark 5 and the upper alignment-measuring mark 11 used for the measurement of the deviation of the photoresist mask 9 show the status that each of them is formed on the scribing region 18 for dicing without adversely affecting for forming a semiconductor device 13. The lower alignment-measuring mark 5 and the upper alignment-measuring mark 11 are formed in such a manner that the upper alignment-measuring mark 11 is placed within the lower alignment-measuring mark 5 as shown in FIG. 4.

In this embodiment of the manufacturing processes of the semiconductor device 13, as shown in FIG. 3, the measurement direction of the deviation is selected in X-direction. The upper alignment-measuring mark 11 formed in the scribing region 18 are placed so that ratios of removed areas of the photoresist film 7 and ratios of remaining areas of the photoresist film 7 are about same each other across the upper alignment-measuring mark 11 along X-direction and symmetrically.

In detail, the upper alignment-measuring mark 11 is placed at a specified position in the scribing region 18 on the semiconductor device 1 so that a ratio between a total area of photoresist-removed portions and a total area of photoresist-remaining portions within a right side region extending in a right direction from a center of the upper alignment-measuring mark 11 is equal approximately to that within a left side region extending in a left direction from the center of the upper alignment-measuring mark 11.

With thus a configuration, the deviation of the photoresist mask 9 is measured correctly since the shape loss (deformation) of the photoresist film 7 due to the data ratio of the upper alignment-measuring mark 11 is almost the same in X-direction that is to be measured and therefore a margin of error in appearance due to the shape loss of photoresist film 7 is hardly occurred. In other words, since a photoresist film 7 of a certain measurement mark is not affected by adjoining other photoresist film 7 of the measurement mark and also by the photoresist film 7 remaining in the scribing region 18 when the photoresist film 7 making up the upper alignment-measuring mark 11 is developed, the photoresist pattern 10 making up the upper alignment-measuring mark 11 hardly changes its shape and therefore the shapes of the cross section of the left side and the right side of the upper alignment-measuring mark 11 are almost the same as shown in FIG. 5.

Figure 7:
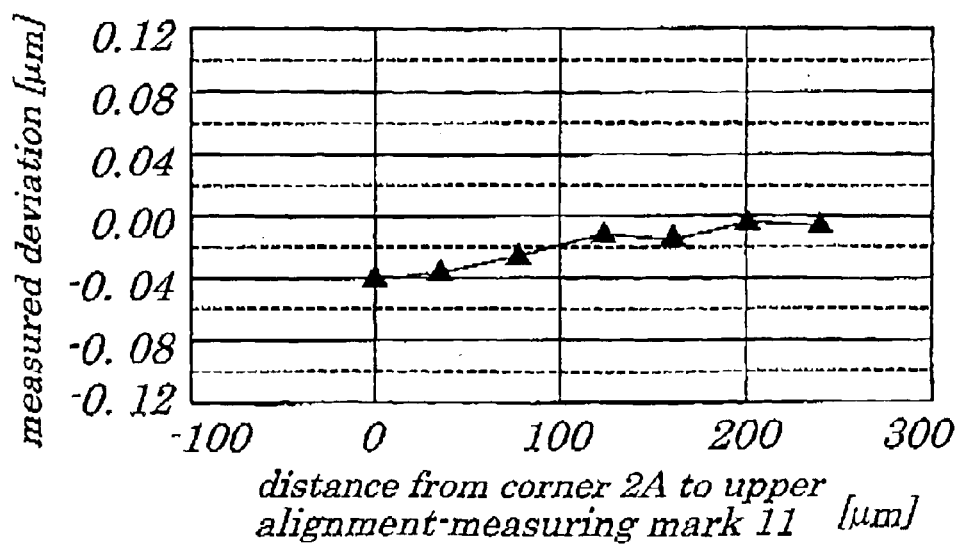
FIG. 7 is a graph for showing effects of the method for manufacturing the semiconductor device according to each of the first embodiment and the second embodiment of the present invention.

Concretely, the result of a relationship shown in FIG. 7 is obtained since the deviation depending on the distance is changed in the case that the width of the scribing region 18 being surrounded by the device forming region 2 is set about 100 μm and that the upper alignment-measuring mark 11 being formed in the scribing region 18 is formed along X-direction which starts from a specified corner (intersection) 2A of the device forming region 2. The characteristic of FIG. 7 shows that the measurement data of deviations of the photoresist mask 9 (the vertical axis) change depending on the distance from the specified corner 2A to the upper alignment-measuring mark 11 in X-direction (horizontal axis), and that the measurement data of the deviations hardly change when the distance is set to be more than about 200 μm. This experiment results also indicate that the location of the photoresist mask 9 is measured correctly by placing the photoresist film making up the upper alignment-measuring mark 11 apart more than about 200 μm from the specified corner 2A of the device forming region 2. Though the width of the scribing region 18 is generally set to a range of 80 μm to 120 μm, almost the same effect is obtained also in the above range.

Next, an n-type semiconductor region 12 is selectively formed on the semiconductor substrate 1, as shown in FIG. 1B, implanting n-type impurities such as phosphorus (P) through the opening region 8 in the device forming region 2 using the photoresist mask 9, regarding the deviation of the photoresist mask 9 with specified pattern having the opening region 8 as in the allowable range. In this case, the above impurities do not implanted into the mark forming region 3 due to the masking effect of the photoresist film 7 and the insulating film 6, since both of the photoresist film 7 and the insulating film 6 are formed in the mark forming region 3.

As shown in FIG. 1C, the photoresist mask 9 and the photoresist pattern 10 on the semiconductor substrate 1 are removed by a method such as an ashing. Then after annealing and stabilizing thermally the semiconductor substrate 1 including the n-type semiconductor region 12, a semiconductor device 13 as shown in FIG. 2 is manufactured by dicing the semiconductor substrate 1 in each semiconductor chip along with the scribing region 18.

In this way, according to this embodiment of the manufacturing procedures of the semiconductor device the photoresist film making up the upper alignment-measuring mark 11 is formed apart from the specified corner 2A of the device forming region 2 formed adjacent to the scribing region 18 in the distance of more than 200 μm. Therefore, the measurement errors in appearance due to the deformation of the photoresist film are hardly occurred since the deformation of the photoresist film 7 based on the data ratio of the upper alignment-measuring mark 11 can be set almost the same in X-direction to be measured.

In conclusion, the deviation of the photoresist mask 9 is measured correctly by decreasing the deformation of the photoresist mask 9 making up the alignment mark for the measurement in the development process.

Second Embodiment

Figure 6:
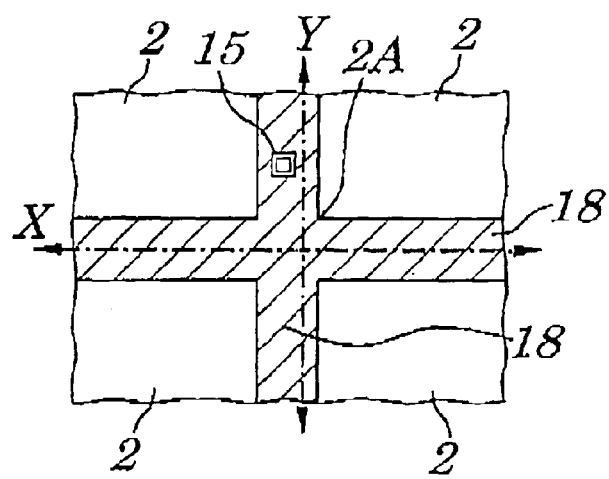
FIG. 6 is a plan view showing a main part of a semiconductor substrate obtained by performing a main process in a method for manufacturing a semiconductor device according to a second embodiment of the present invention.

FIG. 6 is a plan view showing a main part of a semiconductor substrate obtained by performing a main process in a method for manufacturing a semiconductor device according to a second embodiment of the present invention. A main difference between the manufacturing method according to the first embodiment and that according to the second embodiment is that Y-direction is elected as a measuring direction for measuring a relative deviation from a right alignment between a lower alignment-measuring mark 5 and an upper alignment-measuring mark 15 in the second embodiment.

In the manufacturing method of the semiconductor device according to this embodiment, the measurement direction of the deviation is selected in Y-direction and the upper alignment-measuring mark 15 formed in the scribing region 18 is placed so that ratios of removed areas of the photoresist film 7 to remaining areas of the photoresist film 7 between one side of the upper alignment-measuring mark 15 and the other side of the upper alignment-measuring mark 15 along with a measurement direction in a region excepting a cell region is almost the same.

Concretely, the measurement results of the deviation are confirmed that the results hardly change in the same way as embodiment 1, placing the upper alignment-measuring mark 15 apart from the specified corner (intersection) 2A of the device forming region 2 for more than about 200 μm, setting the value of the width of the scribing region 18 being surrounded by the device forming region 2 at about 100 μm and forming the upper alignment-measuring mark 15 adjacent to the scribing region 18 along with Y-direction from the specified corner (intersection) 2A of the device forming region 2.

As described above, the second embodiment can achieve approximate same effects as the first embodiment.

Third Embodiment

Figure 8:
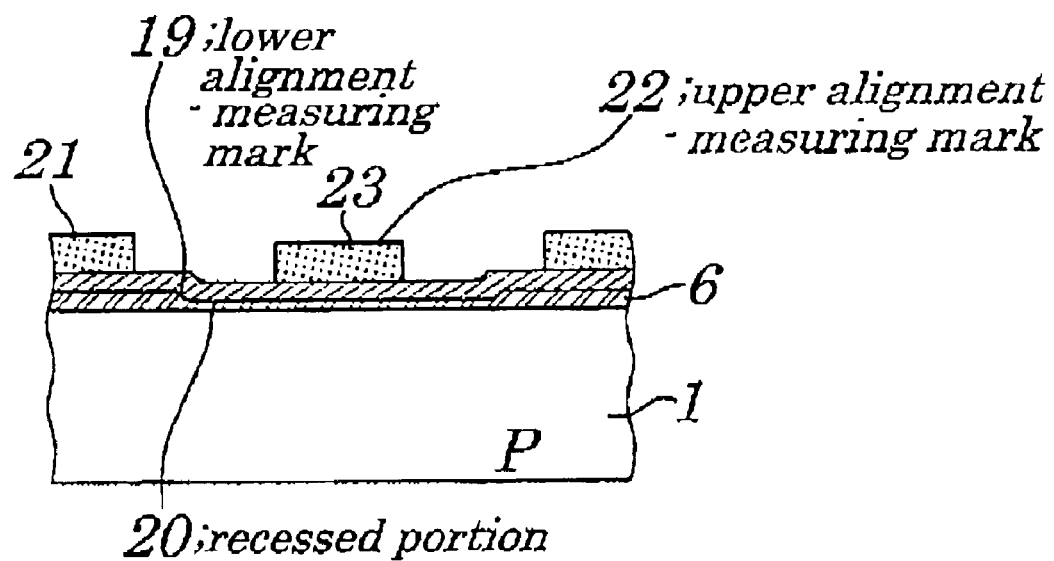
FIG. 8 is a cross sectional view showing a main part of a semiconductor substrate obtained by performing a main process in a method for manufacturing a semiconductor device according to a third embodiment of the present invention.
Figure 9:
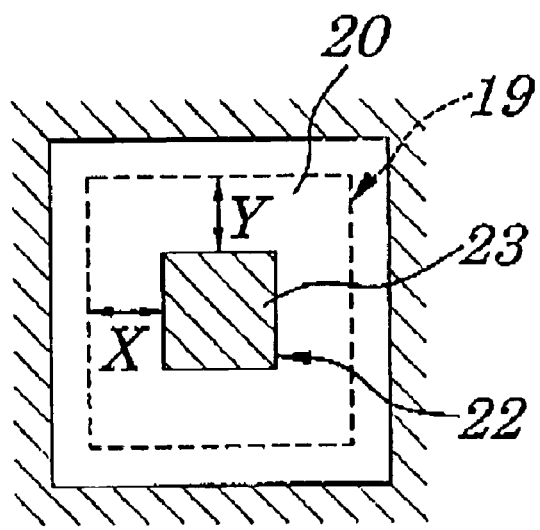
FIG. 9 is an enlarged plan view showing a part of the semiconductor substrate obtained by performing the main process in the method according to the third embodiment.
Figure 10A:
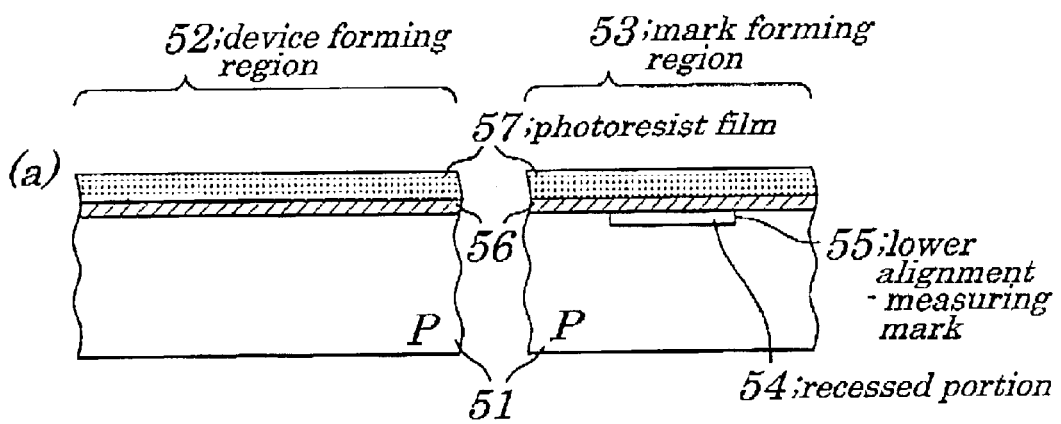
FIGS. 10A, 10B, and 10C are process diagrams for showing in order a method for manufacturing a conventional semiconductor device.
Figure 10B:
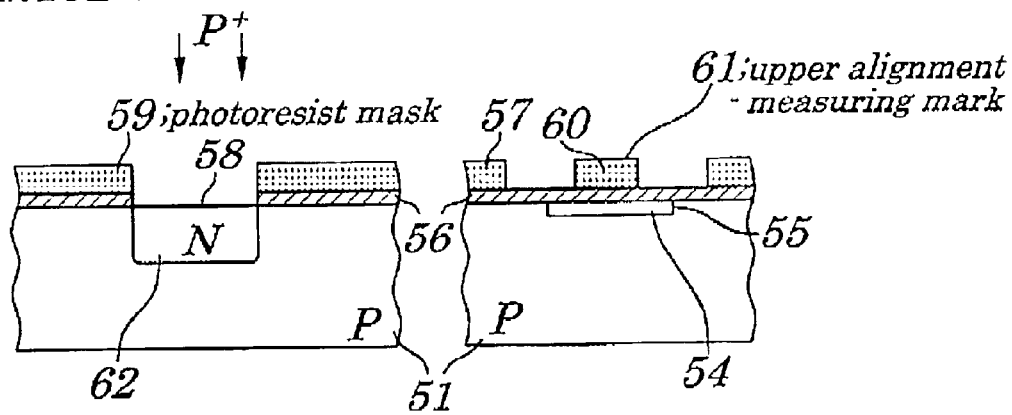
Figure 10C:
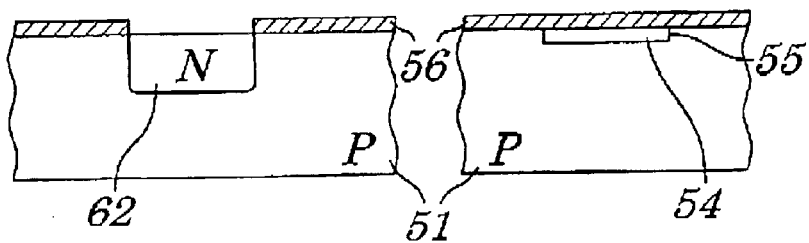
Figure 11:
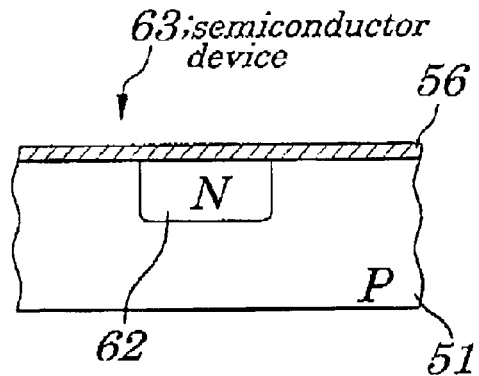
FIG. 11 is a cross section view showing schematically the semiconductor device produced using the conventional method.
Figure 12:
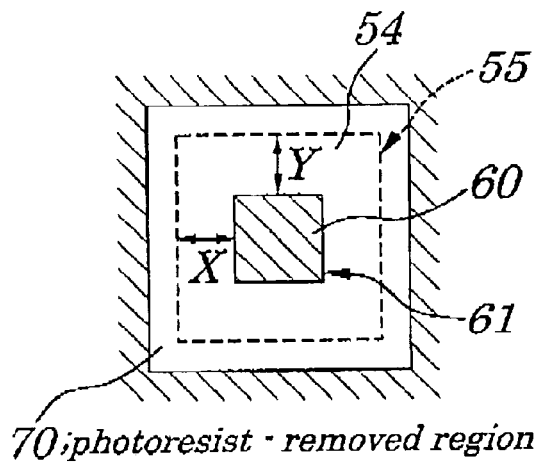
FIG. 12 is an enlarged plan view showing a part of a semiconductor substrate obtained by performing a main process in the conventional method.
Figure 13:
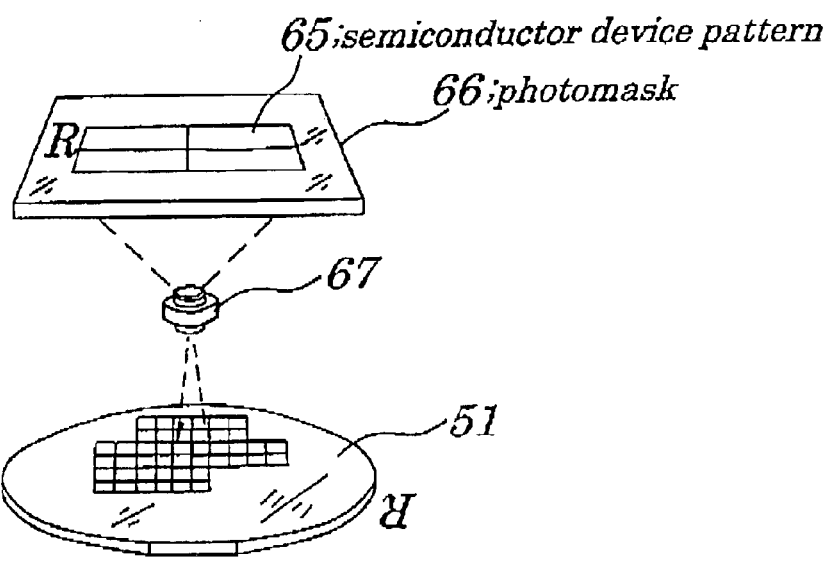
FIG. 13 is a schematic view for explaining a method for transferring a mask pattern used in the conventional method.
Figure 14:
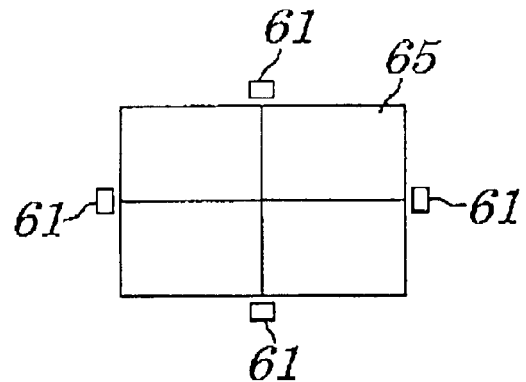
FIG. 14 is a schematic view showing the mask pattern to be transferred used in the conventional method.
Figure 15:
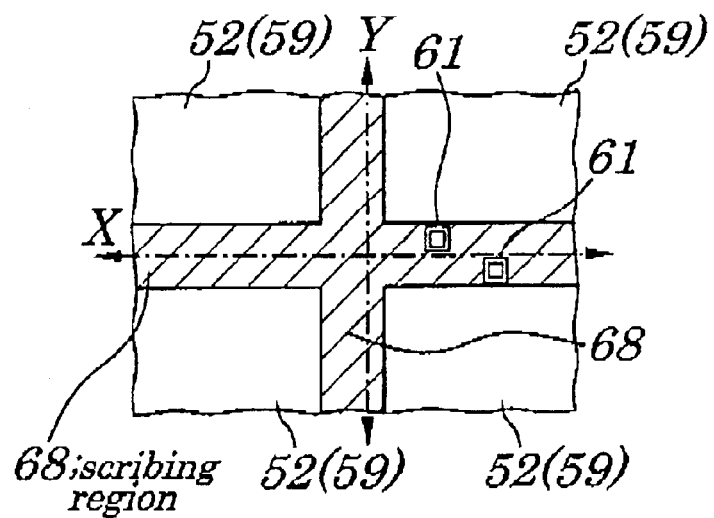
FIG. 15 is a plan view showing a main part of the semiconductor substrate obtained by performing the main process in the conventional method.
Figure 16:
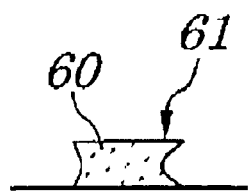
FIG. 16 is a cross sectional view showing a cross sectional shape of a photoresist pattern shape making up an upper alignment-measuring mark formed in the conventional method.

FIG. 8 is a cross sectional view showing a main part of a semiconductor substrate 1 obtained by performing a main process in a method for manufacturing a semiconductor device 13 according to a third embodiment of the present invention, and FIG. 9 is an enlarged plan view showing a part of the semiconductor substrate 1 obtained by performing the main process in the method according to the third embodiment.

A main difference between the manufacturing method according to the first embodiment and that according to the third embodiment is that a lower alignment-measuring mark 19 having a recessed pattern is formed on a surface of an insulating film 6 as shown in FIG. 8 instead of the semiconductor substrate 1 in the third embodiment.

In the manufacturing method of the semiconductor device 13 according to this embodiment, the lower alignment-measuring mark 19 is formed in a scribing region 18 that is to be mark forming region after having formed the insulating film 6 such as an oxide film in all the surface of the semiconductor substrate 1 as shown in FIGS. 8 and 9. In the lower alignment-measuring mark 19, for example, a recessed portion 20 of which a planar shape thereof is of almost square for example is formed in the scribing region 18 as a mark forming region 3 on the semiconductor substrate 1, by performing an etching process or a like.

In the next step, a photoresist film 21 is formed coating the photoresist on all the surface of the substrate substrate 1. Then, an upper alignment-measuring mark 22 made up of a photoresist pattern 23 having a flat planar shaped square, is formed on the mark forming region 3 corresponding to the lower alignment-measuring mark 19, at the same time of the formation of the photoresist mask (not shown) with specified patterns having an opening area in the device forming region 2, by the photolithographic process in almost the same method as in the first embodiment.

As described above, the third embodiment can achieve approximate same effects as the first embodiment, since groundworks forming the lower alignment-measuring mark are only different between the first embodiment and the second embodiment.

It is apparent that the present invention is not limited to the above embodiments but may be changed and modified without departing from the scope and spirit of the invention. For example, the formation region of the alignment mark for the measurement on the aligning side can be selected in the region other than the cell region not restricting to the scribing region although the above embodiments are explained selecting the alignment mark for the measurement on the aligning side in the scribe formation region. Also for example, although the photolithographic technologies are described using the light as a means of exposure, the technologies are able to be applicable to the general photolithographic technologies using electron beams or X-rays other than the light.

The shape of the lower alignment-measuring mark on the aligned side and the upper alignment-measuring mark on the aligning side being formed on the groundwork is not respectively limited to a rectangular shape in a plan view but these two kinds of alignment-measuring marks can have any other shape such as a circular shape or a like. In the relative relationship between the lower alignment-measuring mark on the aligned side and the upper alignment-measuring mark on the aligning side, it is not necessary for the upper alignment-measuring mark on the aligning side to be placed inside of the lower alignment-measuring mark on the aligned side, but it may be possible for the reverse relationship. In other words, it is preferable that both of the lower alignment-measuring mark and the upper alignment-measuring mark are in such shapes or in such arrangements that these two kinds of alignment-measuring marks can measure the relative deviation. In the above embodiments, although the photoresist film making up the upper alignment-measuring mark on the aligning side is set to be about 4 μm in thickness, the film thickness of more than 4 μm is desirable considering the trend in which deeper ion impurity implantation is required in the processes of recent LSIs.

What is claimed is:

1. A method for manufacturing a semiconductor device comprising:

a first step of forming a first alignment-measuring mark having a recessed pattern on a surface of a semiconductor substrate, by using a photoetching process;

a second step of coating said surface of said semiconductor substrate on which said first alignment-measuring mark is formed, with a photoresist film;

a third step of patterning said photoresist film by using a photolithography technique and of forming a photoresist mask with a second alignment-measuring mark on said semiconductor substrate, wherein said second alignment-measuring mark is aligned to be overlaid on said first alignment-measuring mark;

hereby measuring a relative deviation from a right alignment between said first alignment-measuring mark and said second alignment-measuring mark;

wherein said second alignment-measuring mark is placed at a specified position on said semiconductor substrate so that a ratio between a total area of photoresist-removed portions and a total area of photoresist-remaining portions within a first specified region extending in a first measuring direction from a center of said second alignment-measuring mark is equal approximately to that within a second specified region extending in a second measuring direction opposite to said first measuring direction from said center of said second alignment-measuring mark, said first alignment-measuring mark and said second alignment-measuring mark being located outside a cell region, and said first specified region and said second specified region being set outside said cell region.

2. The method for manufacturing the semiconductor device according to claim 1, wherein each of said first alignment-measuring mask and said second alignment-measuring mask is formed as a rectangular shape of a planar pattern.

3. The method for manufacturing the semiconductor device according to claim 1, wherein said photoresist film making up said second alignment-measuring mark is set to be more than 4 μm in thickness.

4. The method for manufacturing the semiconductor device according to claim 1, wherein said first specified region and said second specified region are set to be almost symmetrical with respect to said center line of said second alignment-measuring mark.

5. A method for manufacturing the semiconductor device according to claim 1, wherein said first alignment-measuring mark and said second alignment-measuring mark are located within a scribing region outside said cell region, and said first specified region and said second specified region are set within said scribing region outside said cell region.

6. The method for manufacturing the semiconductor device according to claim 5, wherein said scribing region is set to be within a range of 80 μm to 120 μm in width.

7. A method for manufacturing the semiconductor device comprising:

a first step of forming a first alignment-measuring mark having a recessed pattern on a surface of a semiconductor substrate, by using a photoetching process;

a second step of coating said surface of said semiconductor substrate on which said first alignment-measuring mark is formed, with a photoresist film;

a third step of patterning said photoresist film by using a photolithography technique and of forming a photoresist mask with a second alignment-measuring mark on said semiconductor substrate, wherein said second alignment-measuring mark is aligned to be overlaid on said first alignment-measuring mark;

hereby measuring a relative deviation from a right alignment between said first alignment-measuring mark and said second alignment-measuring mark;

wherein said second alignment-measuring mark is placed at a specified position on said semiconductor substrate so that a ratio between a total area of photoresist-removed portions and a total area of photoresist-remaining portions within a first specified region extending in a first measuring direction from a center of said second alignment-measuring mark is equal approximately to that within a second specified region extending in a second measuring direction opposite to said first measuring direction from said center of said second alignment-measuring mark, said first alignment-measuring mark and said second alignment-measuring mark being located outside a device forming region, and said first specified region and said second specified region being set outside said device forming region; and wherein said second alignment-measuring mark is placed at a distance of more than 200 μm from a corner of said device forming region being adjacent to said first specified region or said second specified region, in said first measuring direction or said second measuring direction.

8. The method for manufacturing the semiconductor device according to claim 7, wherein each of said first alignment-measuring mask and said second alignment-measuring mask is formed as a rectangular shape of a planar pattern.

9. The method for manufacturing the semiconductor device according to claim 7, wherein said photoresist film making up said second alignment-measuring mark is set to be more than 4 μm in thickness.

10. The method for manufacturing the semiconductor device according to claim 7, wherein said first specified region and said second specified region are set to be almost symmetrical with respect to said center line of said second alignment-measuring mark.

11. A method for manufacturing the semiconductor device according to claim 7, wherein said first alignment-measuring mark and said second alignment-measuring mark are located within a scribing region outside said device forming region, and said first specified region and said second specified region are set within said scribing region outside said device forming region.

12. The method for manufacturing a semiconductor device according to claim 11, wherein said scribing region is set to be within a range of 80 μm to 120 μm in width.

13. A method for manufacturing a semiconductor device comprising:

a first step of forming an insulating film on a semiconductor substrate and then of forming a first alignment-measuring mark having a recessed pattern on a surface of formed said insulating film, by using a photoetching process;

a second step of coating said surface of said insulting film on which said first alignment-measuring mark is formed, with a photoresist film;

a third step of patterning said photoresist film by using a photolithography technique and of forming a photoresist mask with a second alignment-measuring mark on said insulting film, wherein said second alignment-measuring mark is aligned to be overlaid on said first alignment-measuring mark;

hereby measuring a relative deviation from a right alignment between said first alignment-measuring mark and said second alignment-measuring mark;

wherein said second alignment-measuring mark is placed at a specified position on said insulting film so that a ratio between a total area of photoresist-removed portions and a total area of photoresist-remaining portions within a first specified region extending in a first measuring direction from a center of said second alignment-measuring mark is equal approximately to that within a second specified region extending in a second measuring direction opposite to said first measuring direction from said center of said second alignment-measuring mark, said first alignment-measuring mark and said second alignment-measuring mark being located outside a cell region, and said first specified region and said second specified region being set outside said cell region.

14. The method for manufacturing the semiconductor device according to claim 13, wherein each of said first alignment-measuring mask and said second alignment-measuring mask is formed as a rectangular shape of a planar pattern.

15. The method for manufacturing the semiconductor device according to claim 13, wherein said photoresist film making up said second alignment-measuring mark is set to be more than 4 $\mu$m in thickness.

16. The method for manufacturing the semiconductor device according to claim 13, wherein said first specified region and said second specified region are set to be almost symmetrical with respect to said center line of said second alignment-measuring mark.

17. A method for manufacturing the semiconductor device according to claim 13, wherein said first alignment-measuring mark and said second alignment-measuring mark are located within a scribing region outside said cell region, and said first specified region and said second specified region are set within said scribing region outside said cell region.

18. The method for manufacturing the semiconductor device according to claim 17, wherein said scribing region is set to be within a range of 80 $\mu$m to 120 $\mu$m in width.

19. A method for manufacturing a semiconductor device comprising:

a first step of forming an insulating film on a semiconductor substrate and then of forming a first alignment-measuring mark having a recessed pattern on a surface of formed said insulating film, by using a photoetching process;

a second step of coating said surface of said insulting film on which said first alignment-measuring mark is formed, with a photoresist film;

a third step of patterning said photoresist film by using a photolithography technique and of forming a photoresist mask with a second alignment-measuring mark on said insulting film, wherein said second alignment-measuring mark is aligned to be overlaid on said first alignment-measuring mark;

hereby measuring a relative deviation from a right alignment between said first alignment-measuring mark and said second alignment-measuring mark;

wherein said second alignment-measuring mark is placed at a specified position on said insulting film so that a ratio between a total area of photoresist-removed portions and a total area of photoresist-remaining portions within a first specified region extending in a first measuring direction from a center of said second alignment-measuring mark is equal approximately to that within a second specified region extending in a second measuring direction opposite to said first measuring direction from said center of said second alignment-measuring mark, said first alignment-measuring mark and said second alignment-measuring mark being located outside a device forming region, and said first specified region and said second specified region being set outside said device forming region; and wherein said second alignment-measuring mark is placed at a distance of more than 200 $\mu$m from a corner of said device forming region being adjacent to said first specified region or said second specified region, in said first measuring direction or said second measuring direction.

20. The method for manufacturing said semiconductor device according to claim 19, wherein each of said first alignment-measuring mask and said second alignment-measuring mask is formed as a rectangular shape of a planar pattern.

21. The method for manufacturing said semiconductor device according to claim 19, wherein said photoresist film making up said second alignment-measuring mark is set to be more than 4 $\mu$m in thickness.

22. The method for manufacturing said semiconductor device according to claim 19, wherein said first specified region and said second specified region are set to be almost symmetrical with respect to said center line of said second alignment-measuring mark.

23. The method for manufacturing the semiconductor device according to claim 19, wherein said first alignment-measuring mark and said second said alignment-measuring mark are located within a scribing region outside said device forming region, and said first specified region and said second specified region are set within said scribing region outside said device forming region.

24. The method for manufacturing said semiconductor device according to claim 23, wherein said scribing region is set to be within a range of 80 $\mu$m to 120 $\mu$m in width.

* * * * *